United States Patent [19]
Liao et al.

[11] Patent Number: 6,100,168
[45] Date of Patent: Aug. 8, 2000

[54] LOCATION SELECTIVE TRANSMUTATION DOPING ON SILICON WAFERS USING HIGH ENERGY DEUTERONS

[75] Inventors: Chungpin Liao; Meihua Chao, both of Taichung; Shan-Ming Lan, Taoyuan, all of Taiwan

[73] Assignee: Industrial Technology Research Institute, Hsin-Chu, Taiwan

[21] Appl. No.: 09/192,452

[22] Filed: Nov. 16, 1998

[51] Int. Cl.$^7$ ................................................ H01L 21/261
[52] U.S. Cl. .......................................... 438/512; 438/974
[58] Field of Search .......................... 438/512, FOR 158, 438/974

[56] References Cited

U.S. PATENT DOCUMENTS

| | | | |
|---|---|---|---|
| 4,027,051 | 3/1977 | Reuschel et al. ........................ | 438/512 |
| 4,129,463 | 12/1978 | Cleland et al. .......................... | 438/512 |
| 4,539,743 | 9/1985 | Anthony et al. .......................... | 29/576 |
| 4,597,165 | 7/1986 | Capasso et al. .......................... | 29/576 |
| 4,910,156 | 3/1990 | Takasu et al. .............................. | 437/17 |
| 5,262,354 | 11/1993 | Cote et al. ................................ | 437/195 |
| 5,573,633 | 11/1996 | Gambino et al. ..................... | 156/636.1 |
| 5,578,523 | 11/1996 | Fiordalice et al. ...................... | 437/190 |
| 5,760,462 | 6/1998 | Barron et al. ............................ | 257/629 |
| 6,027,953 | 2/2000 | Liao et al. ................................ | 438/512 |

*Primary Examiner*—Savitri Mulpuri
*Attorney, Agent, or Firm*—George O. Saile; Stephen B. Ackerman

[57] ABSTRACT

Efficient transmutation doping of silicon through the bombardment of silicon wafers by a beam of deuterons is described. A key feature of the invention is that the deuterons are required to have an energy of at least 4 MeV, to overcome the Coulomb barrier and thus achieve practical utility. When this is done, transmutationally formed phosphorus in concentrations as high as $10^{16}$ atoms per cc. are formed from deuteron beams having a fluence as low as $10^{19}$ deuterons per square cm. As a byproduct of the process sulfur is also formed in a practical concentration range of about $10^{14}$ atoms per cc. This can be removed by annealing at temperatures in the order of 700 ° C. Additional sulfur continues to form as a result of the decay of $P^{32}$. Because of the high energy of the deuterons, several silicon wafers may be processed simultaneously if a suitable mask is available and proper alignment is achieved. It is expected that the additional phosphorus is essentially uniformly deposited throughout the entire thickness of a wafer. Masks, either freestanding or contact, may also be used in order to limit the transmuted regions to particular desired areas.

20 Claims, 4 Drawing Sheets

LOCATION SELECTIVE TRANSMUTATION DOPING ON SILICON WAFERS USING HIGH ENERGY DEUTERONS

FIELD OF THE INVENTION

The invention relates to the general field of semiconductor doping with particular reference to the use of deuteron beams for this purpose.

BACKGROUND OF THE INVENTION

Traditionally, impurity doping in silicon wafers during the fabrication of microelectronic circuits has been performed by using one of two easily implemented, but relatively shallow, impurity injection methods, namely, diffusion and ion implantation. There are occasions, however, when deep, even wafer-penetrating, vertical doping is desired. For example, in the making of smart-power IC devices, in producing power MOSFETs (Metal-Oxide-Semiconductor Field Effect Transistor) or IGBT (Insulated Gate Bipolar Transistor) with low on-resistance while maintaining high breakdown voltage, and in MEMS (Micro-Electro-Mechanical System) applications.

One way of overcoming these problems has been neutron transmutation doping. (NTD). The NTD process is based on the fact that, although silicon has an atomic number of 14 and an atomic weight of 28, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $P^{31}$ (atomic number 15). Since the desired level of phosphorus doping is well below the 3.1 at.% of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor.

While the NTD process has been successfully applied on a number of occasions (see for example Takasu et al. In U.S. Pat. No. 4,910,156), the process does have a number of limitations and shortcomings such as (i) neutron beams are hard to focus into a concentrated beam, (ii) the neutron flux can make surrounding equipment radioactive, and (iii) neutron beams, in practice, have a flux around $10^{14}/cm^2$ whereas a focused proton beam can have a flux anywhere between about $10^{13}$ to $10^{17}/cm^2$. As will be discussed in detail below, deuteron induced nuclear transmutation doping achieves the same end goals as NTD (namely deep, even wafer-penetrating, vertical and uniform n-type doping) but without some of the aforementioned disadvantages. We will refer to this process by its more general name—ion transmutation doping (ITD).

Prior to the work that led up to the present invention, the possibility of deuteron induced ITD on silicon received little or no attention. In particular, detailed information regarding the mechanisms and nuclear reaction Crss-sections, as well as side effects, was not available for practical use. We were unable to find any prior art relating to deuteron transmutation doping. Of interest were several references that teach the use of conventional doping methods in conjunction with deuteron bombardment for the purpose of creating lattice damage and hence areas of high resistivity. Examples of these include Anthony et al. (U.S. Pat. No. 4,539,743) and Capasso et al. (U.S. Pat. No. 4,597,165). As will be explained below, a side effect of deuteron induced ITD is the formation of some sulfur. The use of sulfur compounds in majority carrier devices is expored by Barron et al. (U.S. Pat. No. 5,760,462), suggesting that sulfur could actually be used to advantage although in our case any such byproduced sulfur would be likely, at a minimum, to damage any iron containing equipment with which it came in contact. A method for removing this sulfur byproduct is included as part of the present invention.

SUMMARY OF THE INVENTION

It has been an object of the present invention to increase the concentration of donor atoms in silicon under controlled conditions.

A further object of the invention has been to achieve said increase through the transmutation of silicon isotopes into phosphorus as a result of deuteron bombardment.

Another object of the invention has been that said process be cost-effective and fully compatible with existing techniques for the manufacture of silicon integrated circuits.

These objects have been achieved through the bombardment of silicon wafers by a beam of deuterons. A key feature of the invention is that the deuterons are required to have an energy of at least 4 MeV for practical purposes. When this is done, transmutationally formed phosphorus in concentrations as high as $10^{16}$ atoms per cc. are formed from deuteron beams having a fluence as low as $10^{19}$ deuterons per square cm., since a deuteron beam flux can be very high and thus require much less time than is needed for NTD. As a byproduct of the process sulfur is also formed in a concentration range of about $10^{14}$ atoms per cc. This can be removed by annealing at temperatures in the order of 800–1,000° C., both immediately after deuteron bombardment and also at some later time. Because of the high energy of the deuterons, several silicon wafers may be processed simultaneously. It follows that the additional phosphorus is uniformly deposited throughout the entire thickness of a wafer. Masks, either freestanding or contact, may also be used in order to limit the transmuted regions to particular desired areas.

DESCRIPTION OF THE PREFERRED EMBODIMENTS

One possible reason why deuteron ITD has not found earlier application in the semiconductor art may be the fact that at low bombardment energies (less than about 400 keV, the upper limit of most implanters), the transmutation effect is practically negligible.

However, if the deuteron bombardment energy is increased to exceed about 4 M eV, a new set of nuclear reactions occur since the Coulomb barrier can now be overcome. A portion of these reactions am summarized in FIG. 6, namely those limited to the socalled (d,γ) reaction where an incident deuteron causes transmutation and emits a γ-ray. Other (spontaneous) reactions are also known to occur and would be expected to have σ(E) values similar to that of the proton transmutation, and possibly much larger.

Equation 61 shows that $Si^{28}$ is transmuted to $P^{30}$ which decays to $Si^{30}$ with a half life of about 2.5 minutes. As reflected in equation 62, some of the $P^{30}$ while it is temporarily present, is also transmuted under deuteron bombardment to $S^{32}$ which is not radioactive.

Figure 6:
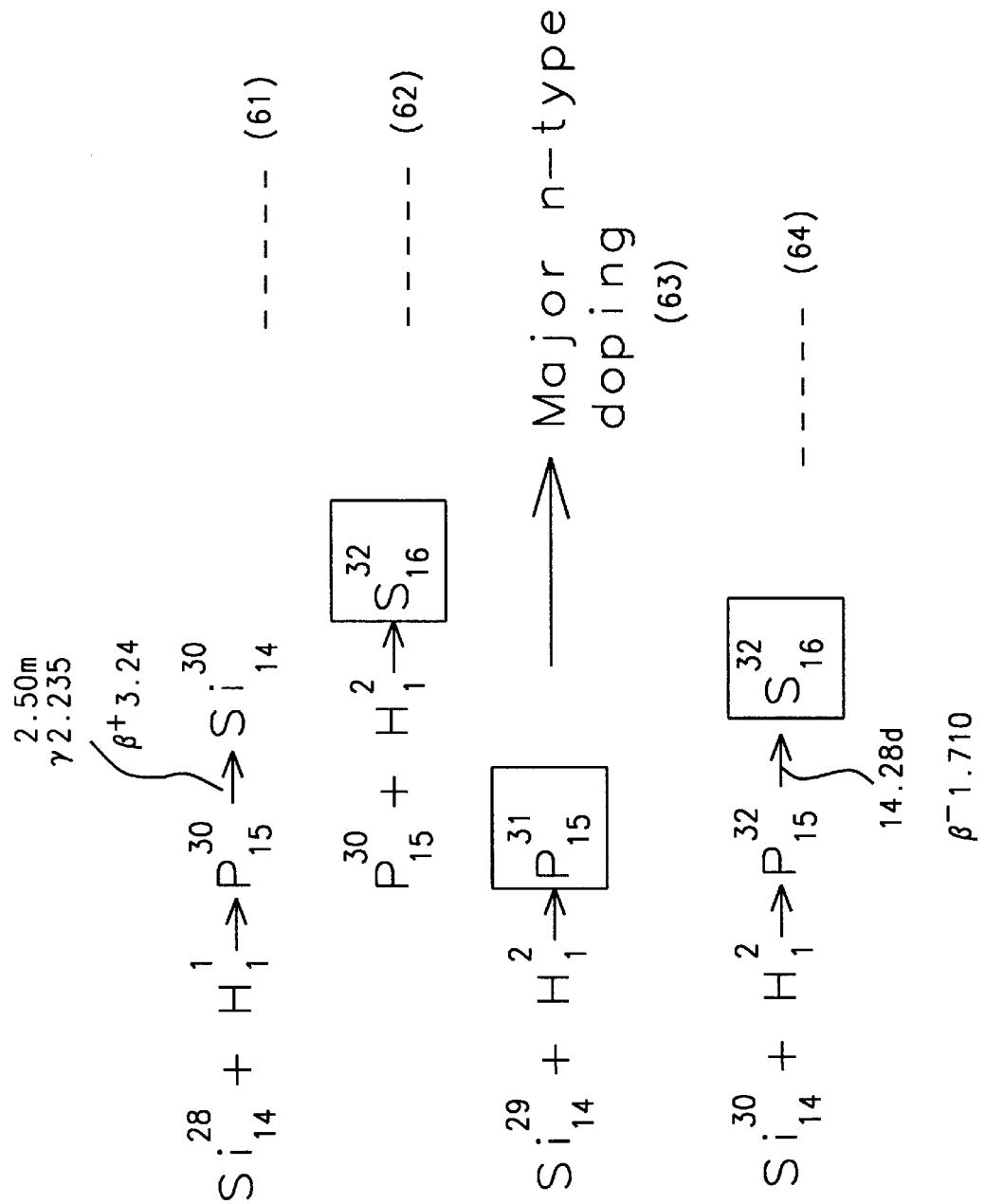
FIG. 6 shows the principal nuclear reactions that occur when high-energy deuterons bombard naturally occurring silicon.

Equation 63 in FIG. 6 shows that $Si^{29}$ is transmuted under deuteron bombardment to $P^{31}$ which is not radioactive, making this the principal path for deuteron transmutation doping of silicon, among the (d,γ)-related nuclear reactions of FIG. 6.

Another path for the production of sulfur during deuteron bombardment is shown in equation 64. $Si^{30}$ transmutes to $P^{32}$ under deuteron bombardment. $P^{32}$ is a weak beta emitter which decays to $S^{32}$ with a half life of 14.28 days.

The minimum deuteron energy required to cause practically useful deuteron-induced ITD was estimated by calculating the work needed to bring a deuteron and a silicon nucleus into contact by overcoming the Coulomb barrier. This was found to be 4 MeV.

Figure 1:
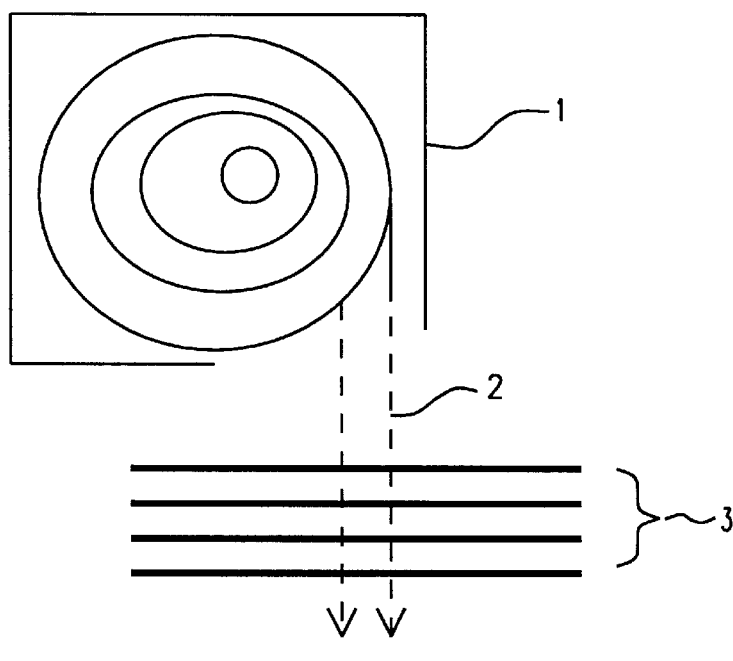
FIG. 1 is a schematic representation of a cyclotron showing an emerging beam of deuterons passing through a stack of wafers.

In order to produce a reliable beam of deuterons having energies above the minimum just cited, a cyclotron was found to be efficient and economical. Other sources such as a linear accelerator or a tandem accelerator could also be used. The deuterons themselves were obtained from ionized deuterium gas. As illustrated in FIG. 1, cyclotron 1 emits deuteron beam 2. Said beam has an energy between about 5 MeV and 30 MeV, with about 10–15 MeV being preferred. The typical current from the cyclotron was between about 10 $\mu A$ and 1 mA, corresponding to a flux between about $10^{14}$ and $10^{16}$ deuterons per square cm with a final fluence of about $10^{17}$ to $10^{18}$ deuterons per square cm being typical.

At these energies, the penetration depth of the deuteron beam is between about 30 microns and 5 mm. This made it possible for several silicon wafers to be bombarded with deuterons at the same time. A stack of such wafers is shown schematically as 3 in FIG. 1. Since the typical width of the deuteron beam was about 2 cm., it was necessary to scan the beam across the surface of the wafers through movement of the latter.

Figure 2:
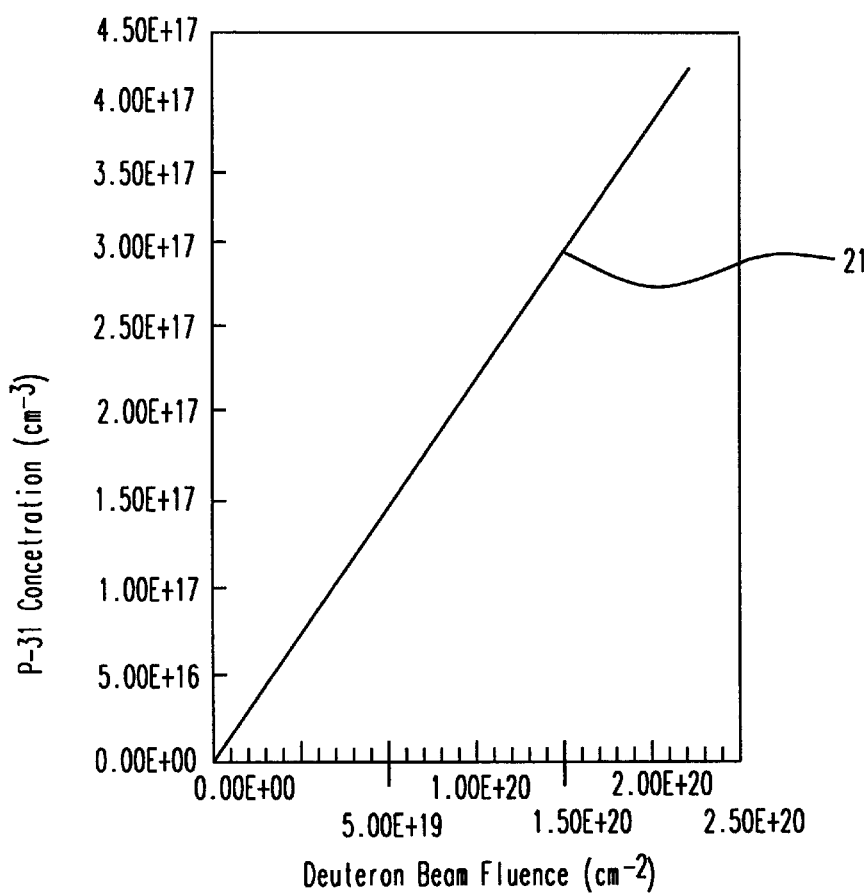
FIG. 2 is a plot of phosphorus concentration as a function of deuteron beam fluence.

After irradiation by deuterons at the above named energies and flux for a period of time between about 5 minutes and 100 minutes, the resistivity and type of the silicon was checked to determine the increase in the number of donor atoms. A plot of the concentration of $P^{31}$ atoms as a function of deuteron beam fluence (at an energy of 30 MeV) is shown in FIG. 2. As can be seen, the P concentration is in linear relationship to the fluence.

It is important to note here that this relationship of transmuted silicon into phosphorus for a given level of deuteron fluence is about an order of magnitude higher than the equivalent result for neutron transmutation and similar to that obtained through proton ITD. This is a significant difference and is one of the major advantages of deuterons over neutrons as well as protons for this kind of application. We also note here that, unlike neutron beams, high current deuteron beams are practical and, furthermore, are magnetically and/or electrically steerable.

Figure 3:
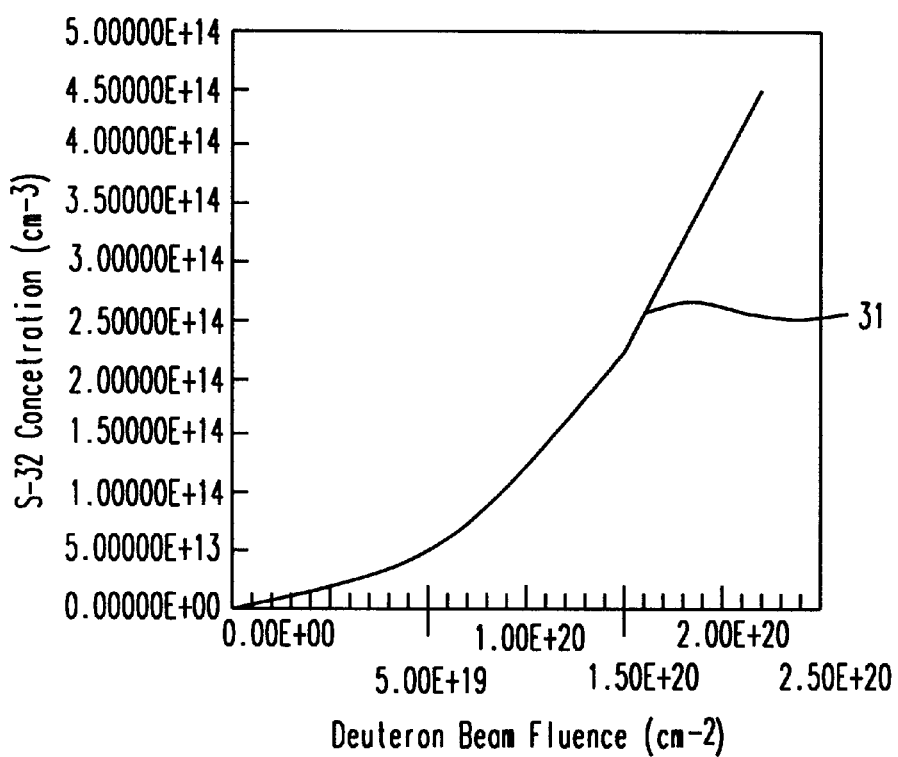
FIG. 3 is a plot of sulfur concentration as a function of deuteron beam fluence.

As discussed above, one byproduct of the deuteron bombardment of silicon is the formation of a certain amount of $S^{32}$. We estimated the concentration of transmutationally formed sulfur immediately following deuteron bombardment as a function of the deuteron beam fluence by numerical solution of the (d,γ) reaction-related coupled nuclear reaction equations. The results are illustrated in FIG. 3 where it can be seen that even at a practically high fluence, the S concentration did not exceed $4.5 \times 10^{14}$ atoms/cc.

Figure 4:
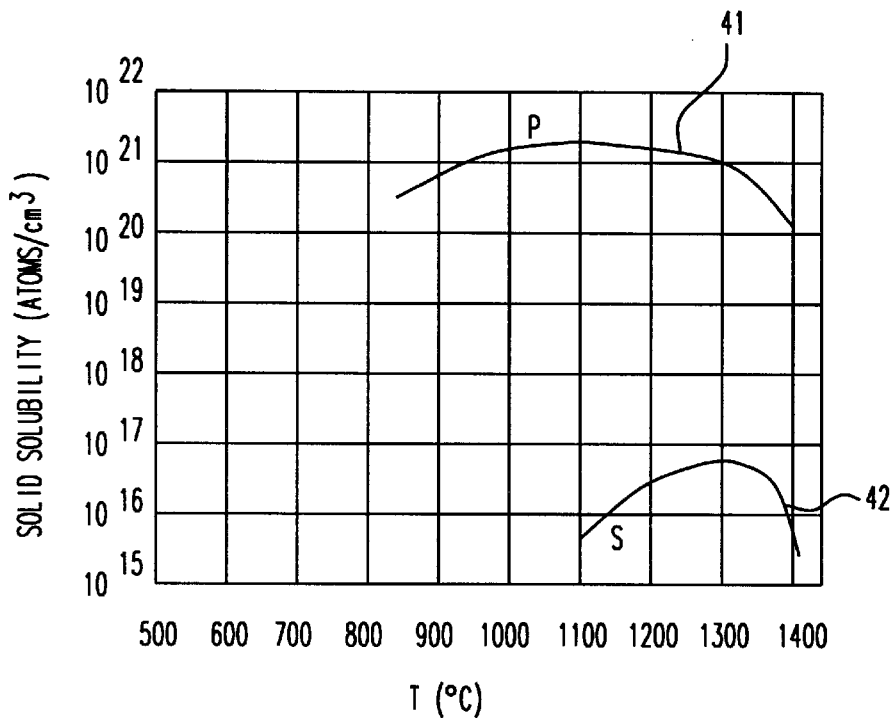
FIG. 4 is a plot of solid solubility as a function of temperature for phosphorus and sulfur in silicon.
Figure 5:
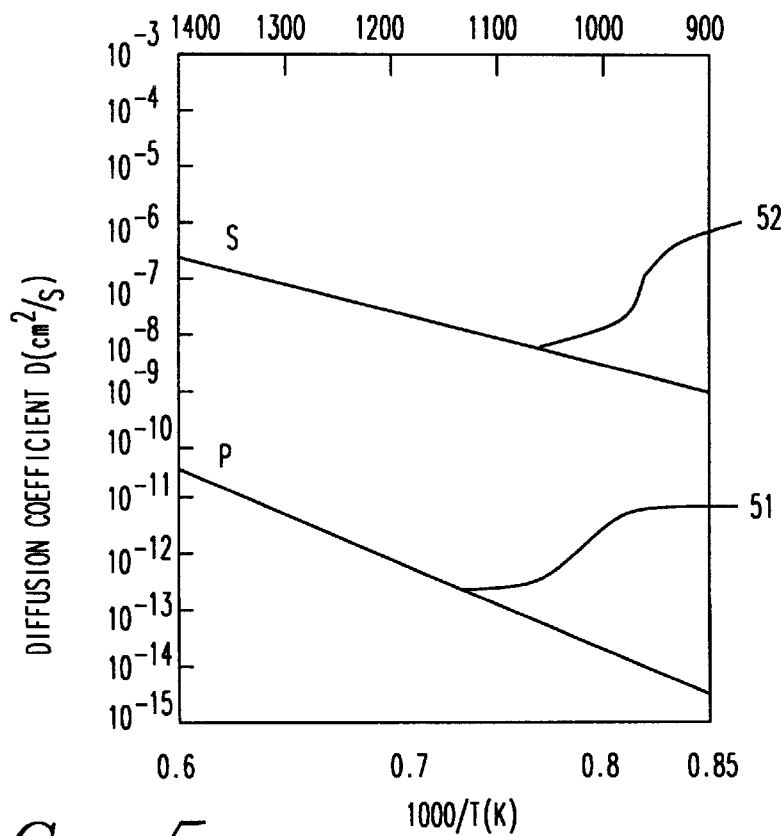
FIG. 5 is a plot of the diffusion coefficient as a function of temperature for phosphorus and sulfur in silicon.

Fortunately, the solubility of sulfur in silicon is low, particularly when compared to phosphorus. As may be seen in FIG. 4, the solubility of phosphorus (curve 41) has a maximum slightly in excess of $10^{21}$ atoms per cc. at about 1,000° C. whereas sulfur peaks at about $3 \times 10^{16}$ atoms per cc (curve 42) at about 1,300° C. Furthermore, sulfur has a high diffusion coefficient in silicon, again particularly when compared to phosphorus. This can be seen in FIG. 5. Thus, sulfur has a diffusion coefficient in silicon of about $10^{-8} cm^2/sec$ at 1,000° C. (Curve 52) while phosphorus has a diffusion coefficient of about $10^{-14} cm^2/sec$ at 1,000° C. (curve 51).

Because of these two differences in the properties of phosphorus and sulfur when dissolved in silicon, the removal of sulfur that was formed transmutationally as a byproduct of the deuteron bombardment was easy to accomplish. Sulfur present immediately after the deuteron bombardment was removed by heating in vacuum. Prior to this it was necessary to clean the surfaces of the wafers to avoid possible outgassing of surface contaminants. Cleaning was accomplished by means of the following steps:

first, the wafers were rinsed in deionized water for between about 2 and 5 minutes.

This was followed by immersion in a mixture of ammonium hydroxide and hydrogen peroxide at a temperature between about 75 and 80° C. for between about 10 and 15 minutes. Next, they were etched in dilute hydrofluoric acid for between about 10 and 15 seconds and then given a second immersion in a mixture of ammonium hydroxide and hydrogen peroxide at a temperature between about 75 and 80° C. for between about 10 and 15 minutes. Finally, after rinsing in deionized water for between about 2 and 5 minutes; they were dried in nitrogen at a temperature between about 20 and 30° C. for between about 5 and 10 minutes.

Once the wafers had been cleaned, the annealing in vacuum was performed at a temperature between about 700 and 900° C. for between about 30 and 60 minutes. With this done, the concentration of the remaining sulfur was estimated to be less than about $10^{12}$ atoms per cc. By contrast, the concentration of phosphorus atoms remained at its pre-anneal level of about $10^{15}$–$10^{16}$ atoms per cc. However, as already mentioned above, $P^{32}$ (see equation 64 in FIG. 6) is also present and this decays to $S^{32}$ with a half life of 14.28 days. In view of this we recommend that silicon wafers that have been subjected to deuteron bombardment be stored for about one month, following which the annealing process is repeated and normal processing resumed. Although this is somewhat inconvenient, it becomes invaluable for certain specialty applications such as MEMS (microelectronic mechanical systems) because of the large total $P^{31}$ generation cross-section as well as the deep doping capability.

When the process of the present invention is used as described above, it becomes possible to change conductivity type of the silicon in a variety of ways:

from P type to P– from P type to N type, and from N type to N+.

In order to take full advantage of this ability to control the donor density through the entire thickness of a wafer, selective bombardment by deuterons was achieved by using masks. These were of two types. Freestanding proximity masks made from materials such as aluminum, copper, gold, and nickel-iron alloy were made from foils that were between about 0.5 and 2 mm. thick, positioned between about 50 and 1,000 microns away from a wafer.

The second type of mask was a contact mask formed by first depositing a layer of a metal such as aluminum, copper, gold, and nickel-iron alloy. The thickness of the mask material was between about 2 and 10 microns allowing us to achieve a pattern resolution of between about 0.5 and 2 microns.

We note here that the proximity masks make it possible to treat several wafers simultaneously by first aligning several masks and then inserting several wafers without losing said alignment.

While the invention has been particularly shown and described with reference to the preferred embodiments thereof, it will be understood by those skilled in the art that various changes in form and details may be made Without departing from the spirit and scope of the invention.

What is claimed is:

1. A process for doping silicon having a first conductivity type, comprising:

directing a beam of deuterons, having an energy and a fluence, at the silicon, thereby transforming the silicon to a second conductivity type;

cleaning the silicon; and under vacuum, annealing the silicon whereby transmutationally formed phosphorus is activated and transmutationally formed sulphur is removed.

2. The process of claim 1 wherein the energy of the deuterons is between about 5 MeV and 30 MeV.

3. The process of claim 1 wherein the fluence of the deuteron beam is between about $10^{17}$ and $10^{19}$ deuterons/sq. cm.

4. The process of claim 1 wherein the step of annealing the silicon further comprises:

about one month after deuteron bombardment, heating in vacuum at a temperature between about 700 and 900° C. for between about 30 and 60 minutes.

5. The process of claim 1 wherein the concentration of transmutationally formed phosphorus is between about $10^{15}$ and $10^{16}$ per cc.

6. The process of claim 1 wherein the first conductivity type is P and the second conductivity type is P–.

7. The process of claim 1 wherein the first conductivity type is P and the second conductivity type is N.

8. The process of claim 1 wherein the first conductivity type is N and the second conductivity type is N+.

9. The process of claim 1 wherein said deuteron beam is generated by a cyclotron or a linear accelerator or a tandem accelerator.

10. The process of claim 1 wherein said silicon has a maximum thickness that is between about 30 microns and 5 mm.

11. A process for phosphorus doping selected regions of a silicon wafer that has a surface, comprising:

providing a source of energetic deuterons;

through a mask, directing a beam of said deuterons at the surface of the silicon wafer for a period of time;

cleaning the surface of the silicon wafer; and under vacuum, annealing said silicon wafer thereby removing transmutationally formed sulphur.

12. The process of claim 11 wherein the source of energetic deuterons is a cyclotron or a linear accelerator or a tandem accelerator.

13. The process of claim 11 wherein the time for which the deuteron beam is directed at the silicon wafer is between about 5 minutes and 100 minutes.

14. The process of claim 11 wherein the deuterons have an energy between about 5 MeV and 30 MeV.

15. The process of claim 11 wherein said beam of deuterons has a fluence between about $10^{17}$ and $10^{19}$ deuterons/sq. cm.

16. The process of claim 11 wherein the step of cleaning the surface of the silicon wafer further comprises the sequential steps of:

rinsing in deionized water for between about 2 and 5 minutes;

immersing in a mixture of ammonium hydroxide and hydrogen peroxide at a temperature between about 75 and 80 E C. for between about 10 and 15 minutes;

etching in dilute hydrofluoric acid for between about 10 and 15 seconds;

immersing once more in a mixture of ammonium hydroxide and hydrogen peroxide at a temperature between about 75 and 80 E C. for between about 10 and 15 minutes;

rinsing in deionized water for between about 2 and 5 minutes; and drying in nitrogen at a temperature between about 20 and 30 E C. for between about 5 and 10 minutes.

17. The process of claim 11 wherein the step of annealing the silicon wafer further comprises:

about one month after deuteron bombardment, heating in vacuum at a temperature between about 700 and 900 E C. for between about 30 and 60 minutes.

18. The process of claim 11 wherein the concentration of active donor ions in the selected regions is between about $10^{15}$ and $10^{16}$ per cc.

19. The process of claim 11 wherein the mask is a contact mask formed from a material selected from the group consisting of aluminum, copper, gold, and nickel-iron alloy.

20. The process of claim 11 wherein the mask is a free standing proximity mask formed from a material selected from the group consisting of aluminum, copper, gold, and nickel-iron alloy.

* * * * *